(12) United States Patent
Shmatovich et al.

(10) Patent No.: US 7,918,670 B2
(45) Date of Patent: Apr. 5, 2011

(54) CABLE ASSEMBLY

(75) Inventors: Chris A. Shmatovich, Oroville, CA (US); Gordon G. Masor, Petaluma, CA (US)

(73) Assignee: Joy Signal Technology, LLC, Chico, CA (US)

( * ) Notice: Subject to any disclaimer, the term of this patent is extended or adjusted under 35 U.S.C. 154(b) by 0 days.

(21) Appl. No.: 12/410,849

(22) Filed: Mar. 25, 2009

(65) Prior Publication Data

US 2009/0246981 A1     Oct. 1, 2009

Related U.S. Application Data

(60) Provisional application No. 61/040,230, filed on Mar. 28, 2008.

(51) Int. Cl.
*H01R 12/00*     (2006.01)
(52) U.S. Cl. ........................................................ 439/67
(58) Field of Classification Search .................. 439/66, 439/67, 493, 259–260, 632
See application file for complete search history.

(56) References Cited

U.S. PATENT DOCUMENTS

| | | | | |
|---|---|---|---|---|
| 4,895,523 | A * | 1/1990 | Morrison et al. | 439/67 |
| 5,161,986 | A * | 11/1992 | Gulbranson et al. | 439/92 |
| 5,971,773 | A * | 10/1999 | Riddle | 439/67 |
| 6,012,928 | A * | 1/2000 | Lopata et al. | 439/67 |
| 6,086,385 | A * | 7/2000 | Wang et al. | 439/67 |
| 6,152,742 | A * | 11/2000 | Cohen et al. | 439/60 |
| 6,997,720 | B2 * | 2/2006 | Perret et al. | 439/67 |
| 7,291,031 | B2 | 11/2007 | Crofoot et al. | |
| 2006/0252310 | A1 * | 11/2006 | Yamada et al. | 439/579 |

* cited by examiner

*Primary Examiner* — Jean F Duverne
(74) *Attorney, Agent, or Firm* — Renner, Otto, Boisselle & Sklar, LLP

(57) ABSTRACT

An electrical connector includes a flex circuit, and a spring-and-pressurized-gas mechanism for selectively pushing electrical contacts of the flex circuit against contacts of an interposer used to make electrical contact with a part to be electrically tested, a device under test (DUT). The mechanism includes a pair of pawls that are rotated to hook onto posts of the board to pull the electrical connector toward and into contact with the contacts of the interposer. The mechanism has a chamber for receiving pressurized gas, to push against a piston, to compress a spring that is mechanically coupled to and rotates the pawls. The mechanism is biased such that the electrical connector engages the interposer when gas pressure is removed, allowing the connector to remain engaged with interposer using only the forces from the spring.

18 Claims, 4 Drawing Sheets

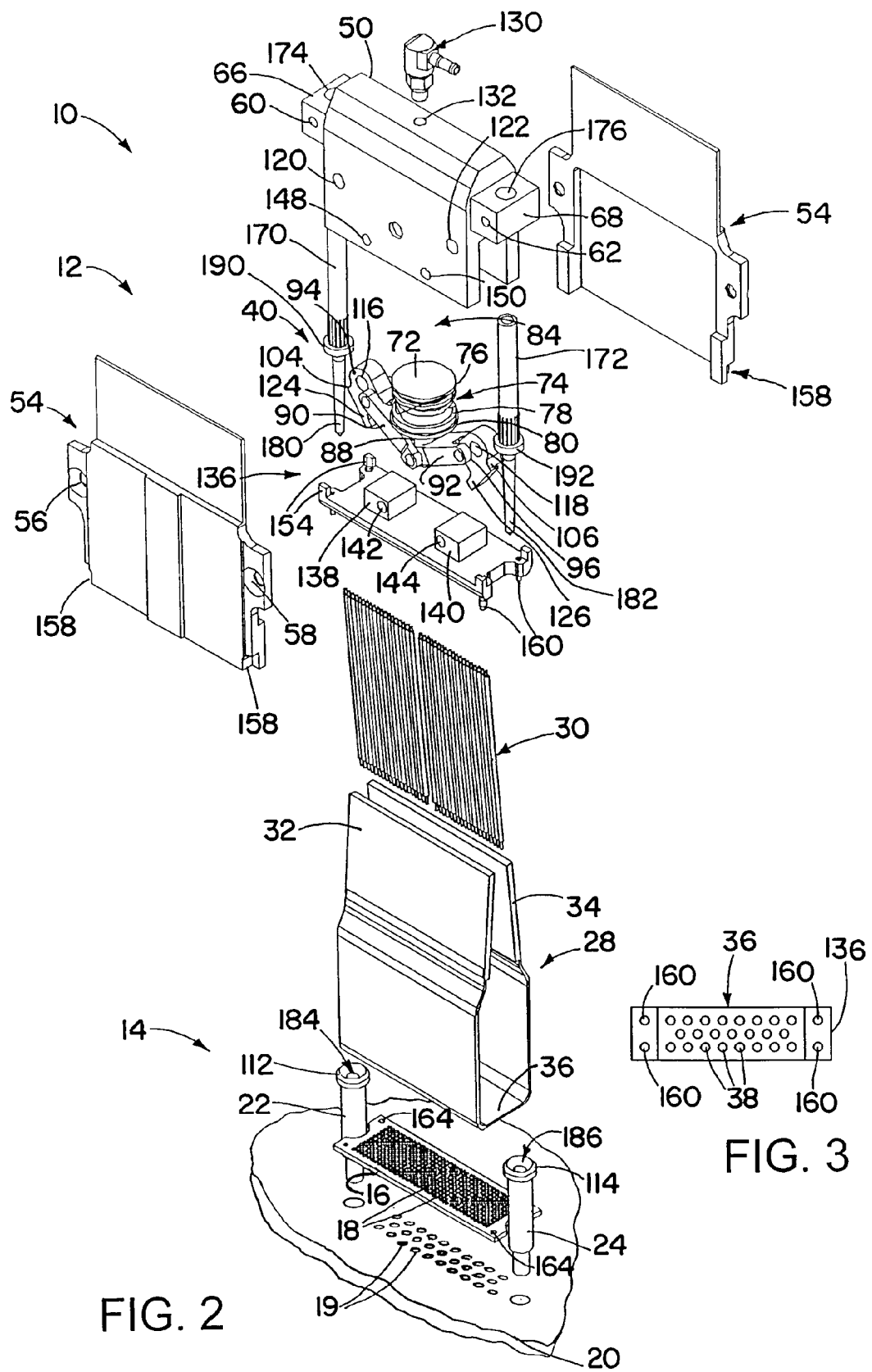

US 7,918,670 B2

CABLE ASSEMBLY

This application claims priority under 35 USC 119 to U.S. Provisional Application No. 61/040,230, filed Mar. 28, 2008, which is incorporated herein by reference in its entirety.

BACKGROUND OF THE INVENTION

1. Field of the Invention

This invention relates to electrical connectors, and to methods for coupling together and de-coupling electrical connectors.

2. Description of the Related Art

In the field of silicon chip testing, probe cards with multiple probes attached have been used to contact specific, accurately-located probe points on the chip. Multiple transmission line cables have been used to communicate the probe-board positions with an attendant test device or test computer. Typically, the interface between the test computer and the probe card has been a multiplicity of spring pins (commonly referred to as "pogo pins") positioned to engage the probe board in compression, and coupled to the transmission lines to the cable. However, for some testing applications many pins, i.e., 10,000 pins or more, are required, making the forces normal to the probe board substantial. Deflection of the probe board caused by the total compressive force of the pogo pins will cause the probe pins to move and possibly lose their accurate positioning.

Many methods have been employed in the past to ameliorate this loss of accurate positioning of the probe pins. Examples of such methods are putting reinforcing strips on the board surface, using a vacuum support of the probe board, and reducing individual spring pin forces. None of these methods has been found to completely eliminate the deflection, but at best they merely control the deflection to an acceptable amplitude. From the foregoing it will be appreciated that there's room for improvement with regard to connections in the field of silicon chip testing, and more broadly in the general field of electrical connection.

SUMMARY OF THE INVENTION

According to an aspect of the invention, a cable end connector with a compression contact interface, electrically connects a circuit board with no electrically mating connector device on the board.

According to an aspect of the invention, a mating circuit board need only have permanently installed metal posts designed to hold the clamping mechanism of an electrical connector that interfaces with it.

According to yet another aspect of the invention, a cable end connector has spring-activated clamping means and an actuator releasing means incorporated.

According to still another aspect of the invention, the clamping means has best mechanical advantage at the spring extended position allowing least air or other gas pressure to release.

According to a further aspect of the invention, an electrical coupling has clamping forces normal to board are neutralized locally, with a zero net force on the circuit board that.

According to a still further aspect of the invention, an electrical connector includes pawls that engage lips on posts of a mating or interfacing connector, to pull the electrical connector into connection with the mating connector. The pawls may be moved using spring forces and pressurized gas, such as shop air.

According to another aspect of the invention, an electrical connector for electrically coupling to a board having an array of board contacts includes: a flex circuit having multiple contacts; and a spring-and-pressurized-gas mechanism for selectively pressing the contacts of the flex circuit against the board contacts.

According to yet another aspect of the invention, an electrical coupling includes: a board having an array of board contacts; and an electrical connector including: a flex circuit having multiple contacts; and a spring-and-pressurized-gas mechanism for selectively pressing the contacts of the flex circuit against the board contacts.

According to still another aspect of the invention, a method of mechanically coupling an electrical connector to a mating board includes the steps: introducing pressurized gas in a chamber of the electrical connector, to thereby cause movement of pawls of the electrical connector to a disengaged position; partially engaging the connector to the mating board by inserting engagement pins of the connector into holes into posts attached to the mating board; and releasing the pressurized gas to cause movement of the pawls from the disengaged position to an engaged position, wherein the movement of the pawls to the engaged position pulls the electrical connector into full engagement with the mating boards.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale:

FIG. 2 is an exploded view of the electrical coupling of FIG. 1;

FIG. 3 is a bottom view of the electrical connector of FIG. 1, showing the electrical connections of the electrical connector;

DETAILED DESCRIPTION

An electrical connector includes a flex circuit, and a spring-and-pressurized-gas mechanism for selectively pushing electrical contacts of the flex circuit against contacts of an interposer used to make electrical contact with a probe card or other printed circuit board. The mechanism includes a pair of pawls that are rotated to hook onto posts of the circuit board to pull the electrical connector toward and into contact with the contacts of the interposer. The mechanism has a chamber for receiving pressurized gas, to push against a piston, to compress a spring that is mechanically coupled to and rotates the pawls. The mechanism is biased such that the electrical connector engages the interposer and the circuit board when gas pressure is removed, allowing the connector to remain engaged with interposer using only the forces from the spring. The forces on the interposer may be substantially balanced, with the downward force against the contacts of the interposer balanced by the upward pull by pawls against the posts of the board.

Figure 1:
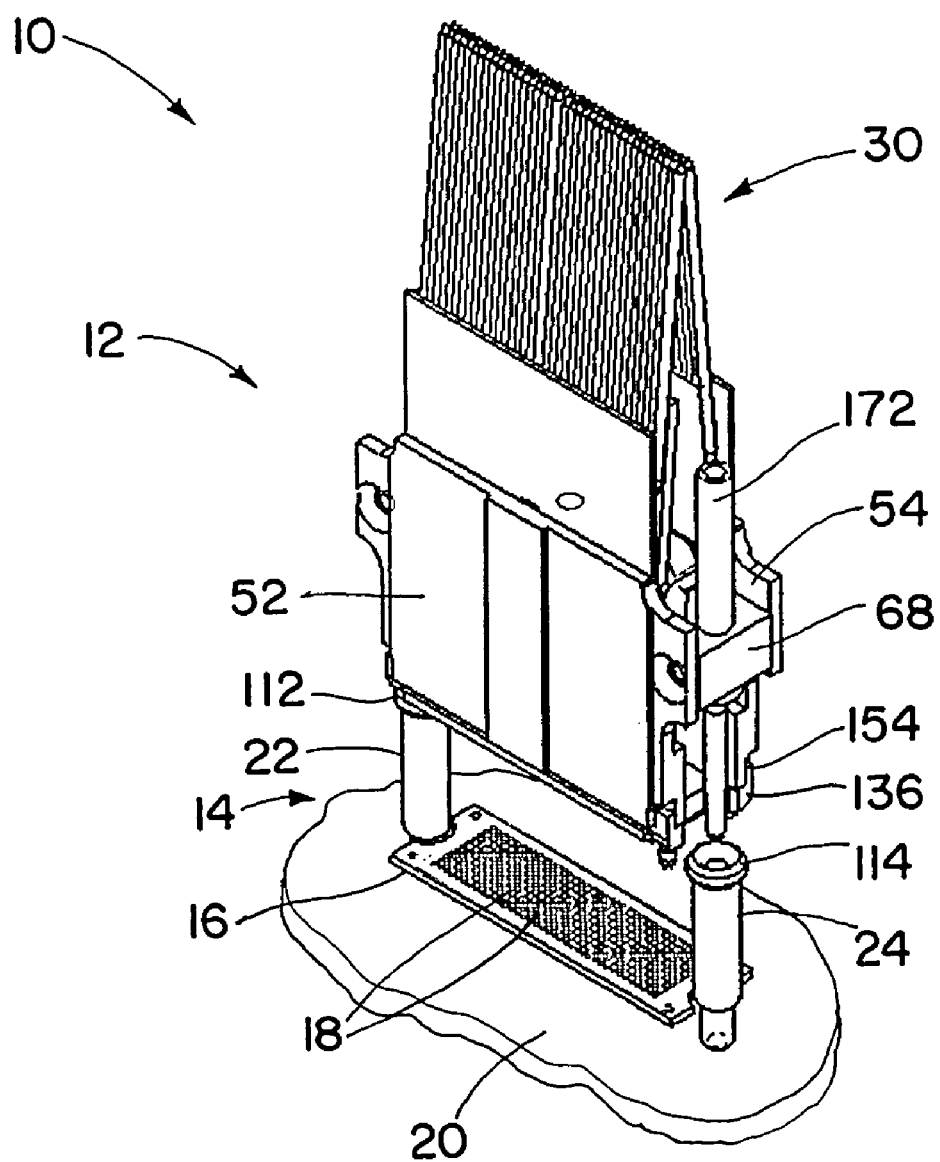
FIG. 1 is an oblique view of an electrical coupling in accordance with an embodiment of the invention.

Referring to FIGS. 1 and 2, an electrical coupling 10 includes an electrical connector 12 coupled to an interposer 14. The interposer 14 is a stand-alone part that has a thin plastic body or board 16 with an array of compliant contacts 18 that protrude from either side. In use, the interposer 14 is sandwiched between two planar arrays of contacts, where the pitch and spacing of the contacts is aligned with the pitch and spacing of the compliant contacts 18 of the interposer 14. A clamping force is applied to compress the arrays of contacts together. This deflects the individual contacts 18 in the interposer 14, and creates the necessary normal force at each contact for valid electrical connection. The contact pads 18 are used for electrically coupling to contacts of the connector 12 to contact pads 19 on a probe card printed circuit board 20. A pair of posts 22 and 24 are attached to the circuit board 20.

The connector 12 includes a folded flex circuit 28 for making electrical contact between the series of coaxial cables 30, and the contacts 18. The flex circuit 28 has a pair of cable mounting regions 32 and 34 where the coax cables 30 are electrically coupled to conductive lines of the flex circuit 28. In order to have a high density of electrical contacts, the flex circuit 28 may have multiple layers, for example having four layers of conductive lines. The conductive lines of each layer are electrically coupled to respective groups of the coaxial cables 30. In an example embodiment the flex circuit 28 has four layers of conductive traces, separated from one another by insulating material such as suitable plastic material.

The conductive traces that attach the coaxial cables 30 travel from the cable mounting regions 32 and 34 to an engagement section 36 of the flex circuit 28. On an underside of the engagement section 36, facing the contacts 18, are a series of exposed contacts 38, shown in FIG. 3. The exposed contacts 38 are exposed pads of conductive material that may have the same arrangement as the contacts 18. The engagement section 36 may have conductive vias that bring the conductive traces in the lower layers to the surface as the exposed contacts 38. Coupling between the electrical connector 12 and the interposer 14 is made by pressing the engagement section 36 against the interposer 14. This makes an electrical connection between the exposed contacts 38 of the flex circuit 28, and the contacts 18 of the interposer 14.

The connector 12 includes a mechanism 40 for pressing the exposed contacts 38 against and into electrical contact with the contacts 18. The mechanism 40 is a spring-and-pressurized-gas mechanism that is housed within a connector body 50 of the connector 12. The flex circuit 28 wraps around the connector body 50 and is held in place by a pair of covers 52 and 54 that secure respective portions of the flex circuit 28 between them and the connector body 50. The covers 52 and 54 are secured to the connector body 50 by threaded fasteners such as screws. Screws pass through fastener holes 56 and 58 in the cover 52, and engage corresponding fastener holes 60 and 62 in protrusions 66 and 68 on opposite ends of the connector body 50. Similar holes and fasteners are used to secure the cover 54 to the connector body 50.

The mechanism 40 includes a piston 72 and a spring 74. A first end 76 of the spring 74 bears against the piston 72. A second end 78 of the spring 74 bears against a shelf 80 that is fixed relative to the connector body 50. Introducing pressurized gas, such as pressurized air, in a chamber 84 above the piston 72, pushes the piston 72 down, toward the engagement section 36 of the flex circuit 28. This compresses the spring 74. Release of the pressurized gas allows the spring 74 to return to its uncompressed state, moving the piston 72 upward.

The spring 74 is a coil spring, and the piston 72 has a shaft 88 that passes through the middle of the spring 74. The piston shaft 88 is coupled to a pair of arms 90 and 92, with the arms 90 and 92 able to rotate relative to the piston shaft 88. The arms 90 and 92 are in turn rotatably coupled to respective pawls 94 and 96. The pawls 94 and 96 have respective engagement surfaces 104 and 106 for hooking and engaging radially-outwardly-extending lips 112 and 114 of the posts 22 and 24. The pawls 94 and 96 have central holes 116 and 118. The holes 116 and 118 line up with corresponding holes 120 and 122 in the connector body 50. Suitable pins or other fasteners are inserted into these sets of holes to fix the general location of the pawls 94 and 96 relative to the connector body 50, while still allowing the pawls 94 and 96 to rotate relative to the connector body 50. The pawls 94 and 96 also have downward-extending protrusions 124 and 126.

The connector 12 includes a pressurized gas fitting 130 for directing pressurized gas, such as pressurized air, into the chamber 84. The gas fitting 130 is in a fitting port 132 at the top of the connector body 50.

An anvil 136 is fixedly attached to the connector body 50 at the bottom of the connector body 50. The anvil 136 is made of a rigid material, such as plastic or steel, and is used to provide a firm flat surface to press against the engagement section 36. A pair of blocks 138 and 140 protrude from an upper surface of the anvil 136. The blocks 138 and 140 have holes 142 and 144 that line up with corresponding holes 148 and 150 in the connector body 50. Pins or fasteners pass into the holes in the connector body 50 and the anvil 136 to fixedly couple together the anvil 136 and the connector body 50.

The anvil 136 has upward protrusions 154 along its corners. These protrusions fit into corresponding recesses 158 in the covers 52 and 54. This aids in fixing the covers 52 and 54 in place relative to the anvil 136. On the bottom surface the anvil 136 has downward-protruding pins 160. The pins 160 fit into corresponding board holes 164 in the board or body 16. The pins 160 may have different sizes, for example to allow engagement of the connector 12 and the board 18 only for a predetermined alignment between the two.

The connector 12 includes a pair of engagement pins 170 and 172. The engagement pins 170 and 172 are fixed to the connector body 50 by being press fit into engagement pin holes 174 and 176 in the protrusions 66 and 68. Downward-facing lance ends 180 and 182 of the pins 170 and 172 are used for engaging corresponding post holes 184 and 186 in the posts 22 and 24. The engagement pins 170 and 172 have ridges 190 and 192 that provide a stop to prevent over insertion of the engagement pins 170 and 172 into the engagement pin holes 174 and 176.

Figure 4:
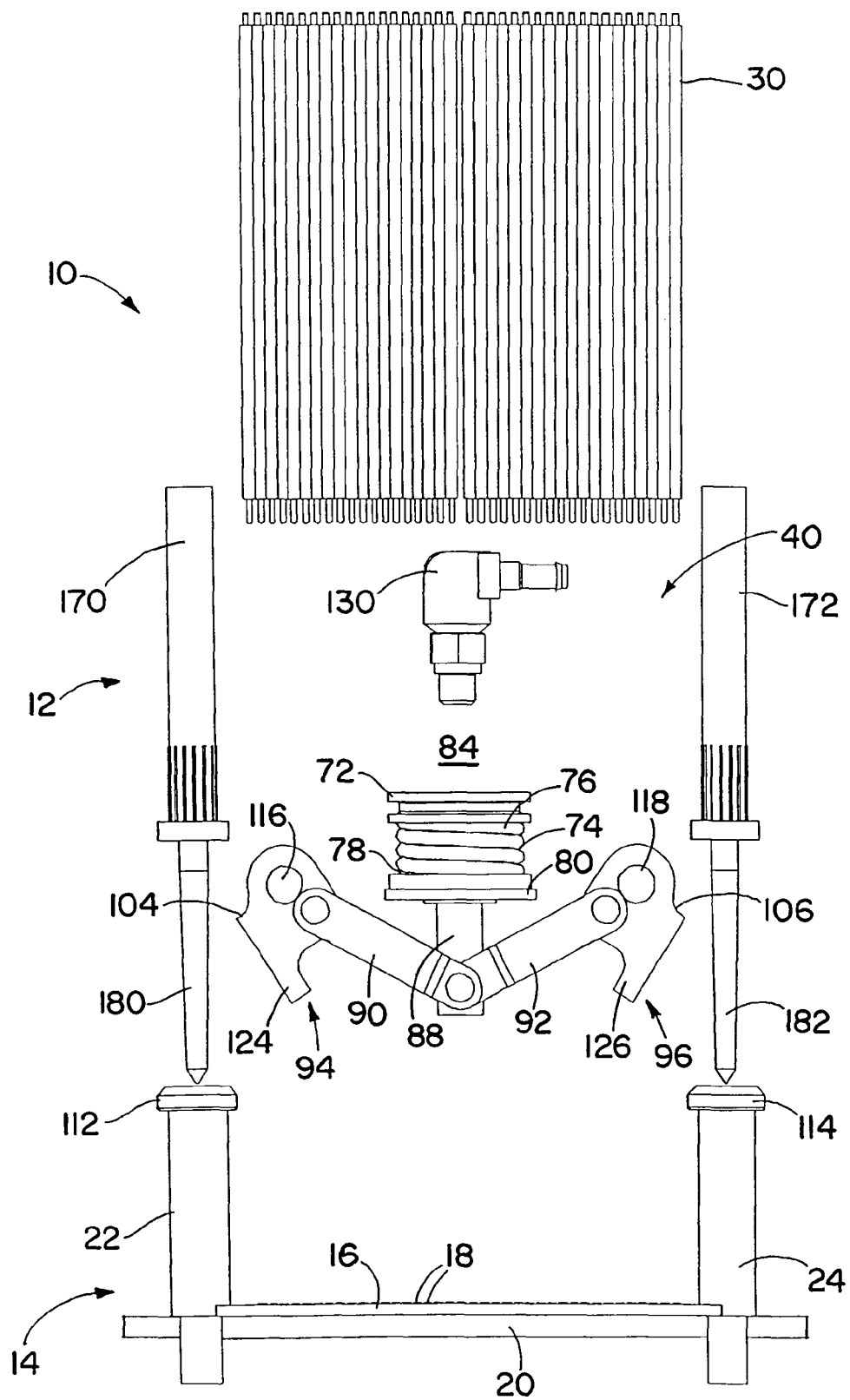
FIG. 4 is a side view of some of the parts of the electrical coupling of FIG. 1, showing a disengaged configuration allowing joining and separation of parts of the electrical coupling.
Figure 5:
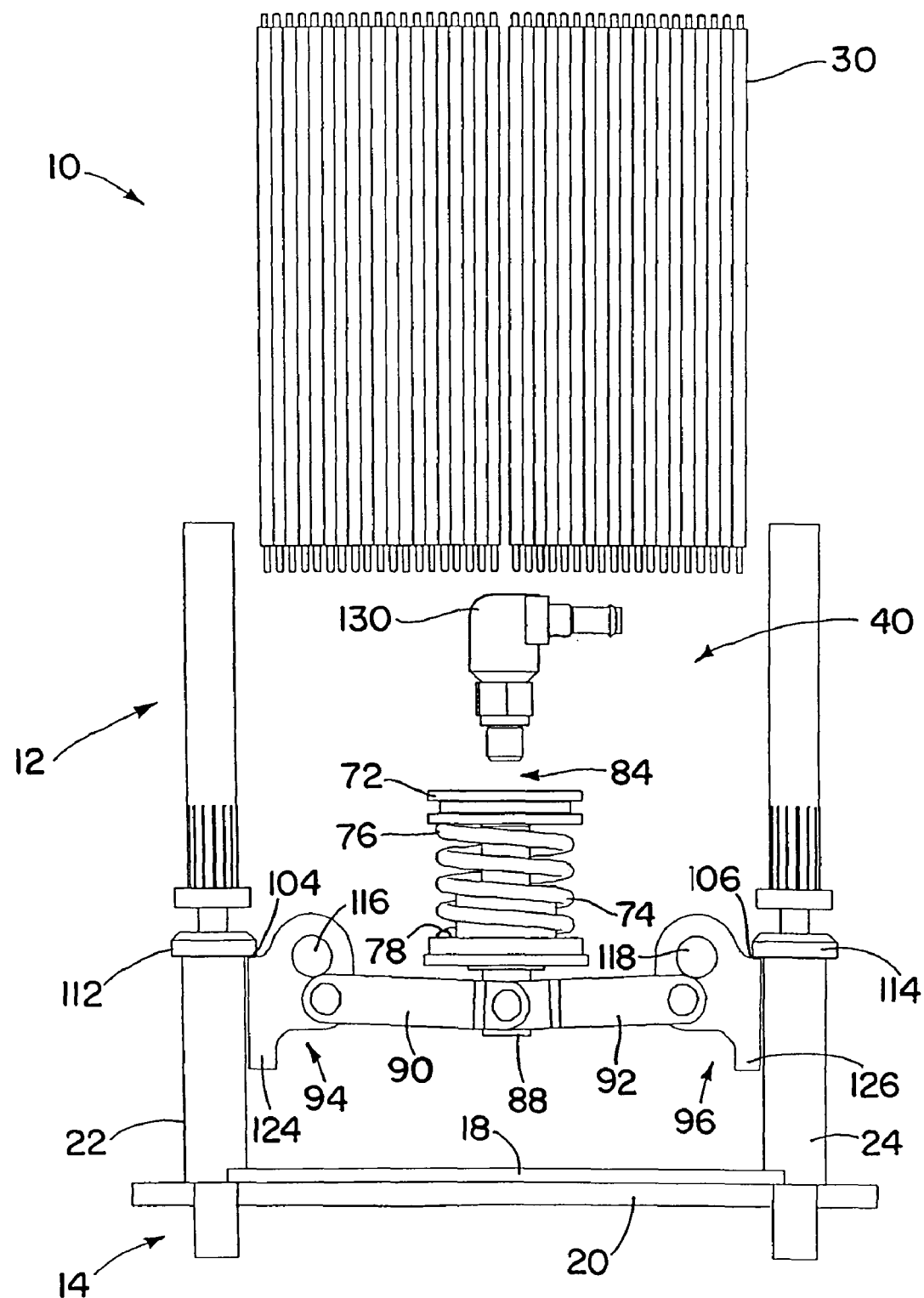
FIG. 5 is a side view of some of the parts of the electrical coupling of FIG. 1, showing an engaged configuration that pulls together the parts of the electrical coupling.

FIGS. 4 and 5 illustrate the two main configurations of the connector 12. FIG. 4 shows parts of the connector 12 with pressurized gas pushing down the piston 72. The pressurized gas forces the piston 72 down, compressing the spring 74. This movement of the piston 72 is transmitted through the arms 90 and 92 to the pawls 94 and 96. This causes rotation of the pawls 94 and 96 to allow sufficient clearance to clear the post lips 112 and 114. In this disengaged configuration the lance ends 180 and 182 can be inserted into the posts 22 and 24. This positions the connector 12 in alignment with the interposer 14, but does not yet press the exposed contacts 38 (FIG. 3) against the contacts 18.

Once the electrical connector 12 is positioned so that the pawls 94 and 96 clear the post lips 112 and 114, the pressurized gas can be released. This brings the electrical connector 12 into full engagement with the interposer 14, as illustrated in FIG. 5. Once the air pressure is removed the spring 74 expands toward its uncompressed state. This moves the piston 72 upward. Movement of the piston 72, including the piston shaft 88, moves upward the coupling points between the piston shaft 88 and the ends of the arms 90 and 92. Since the arms 90 and 92 are coupled to the pawls 94 and 96 away from the centers of the pawls 94 and 96, this results in rotation of the pawls 94 and 96. This rotation causes the pawl engagement surfaces 104 and 106 to catch and hook the post lips 112 and 114. Further rotation of the pawls 94 and 96 holds the electrical connector 12 into engagement with the interposer 14. This causes the flex circuit engagement section 36 to be pressed against the interposer 14. The result is an engagement of the exposed contacts 38 and the contacts 18. The pawl protrusions 124 and 126 prevent over rotation of the pawls 94 and 96. All of the mechanical force to maintain the engagement of the electrically connector 12 and the interposer 14 is provided by the spring 74.

In order to disengage the connector 12 from the interposer 14, pressurized gas is reintroduced through the gas fitting 130. This pushes the piston 72 down, causing rotation of the pawls 94 and 96, and resulting in disengagement of the pawls 94 and 96 from the posts 22 and 24. Once that is done the electrical connector 12 can be simply pulled away from the interposer 14.

Although certain of the figures suggest that the interposer 14 is coupled to the circuit board 20 prior to the engagement of the electrical connector 12, it will be appreciated that alternatively the interposer 14 may travel with the connector 12, coming into contact with the circuit board 20 only during the engagement process.

In a specific embodiment, the electrical connector 12 has a connection density of 430 connectors per square inch. It will be appreciated that a wide variety of other connector densities may be used.

The coupling 10 has the advantage that very little hardware is needed to accomplish the connection with the electrical connector 12. Simple metal posts, such as the post 22 and 24, are all that are needed at each connection point on a circuit board.

The electrical coupling 10 has the advantage of having locally balanced forces. In making the coupling between the electrical connector 12 and the interposer 14, downward forces against the interposer body 16 (the pressing of the flex circuit engagement section 36 against the body 16) are balanced by upward pulling forces resulting from the upward pull on the posts 22 and 24 by the pawls 94 and 96. The localized balanced forces reduce or eliminate deformations of circuit board upon which electrical contact is to be made.

Another advantage of the coupling 10 is that the best mechanical advantage is at the extended position of the spring 74. This reduces the amount of air pressure necessary to move the piston 72 to obtain disengagement of the pawls 94 and 96 from the post 22 and 24.

It is also advantageous that the electrical connector 12 is biased so that it is in the engaged position when no gas pressure is applied. A board or system for testing may thus be moved away from a pressurized gas source after engagement of the connector 12 and the interposer 14, for testing in a controlled environment or different location. Further, no vibration forces from pressurized gas systems interfere with testing, since any pressurized gas system would be disengaged when the coupling 10 is engaged.

The pressurized gas system may be a relatively-low-pressure shop air system, as opposed to higher pressure that is generally available only in pressurized gas cylinders. Shop air systems may have pressure around up to 100 psi. Other prior systems have needed higher gas pressure to operate, such as pressures around 250 psi.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical connector for electrically coupling to a board having an array of board contacts, the electrical connector comprising:
   a flex circuit having multiple contacts; and
   a spring-and-pressurized-gas mechanism for selectively pressing the contacts of the flex circuit against the board contacts; wherein the mechanism includes: a spring; a piston fixed relative to one end of the spring; and a fitting; wherein the fitting is in communication with a chamber on one side of the piston; and wherein movement of the piston causes compression or expansion of the spring.

2. The electrical connector of claim 1, wherein an opposite end of the spring is fixed relative to a connector body of the connector in which the spring and piston are housed.

3. The electrical connector of claim 2,
   wherein the mechanism also includes a pair of engagement pins that are attached to the connector body; and
   wherein the piston is mechanically coupled to a pair of pawls configured to selectively pull the engagement pins into engagement with receiving posts of an engaging part.

4. The electrical connector of claim 3, wherein the pawls have respective post engagement surfaces to selectively engage respective lips on the receiving posts.

5. The electrical connector of claim 3,
   wherein the pawls are rotatably coupled to the connector body, allowing the pawls to rotate with respect to the connector body; and
   wherein a pair of arms are rotatably coupled both to piston and respective of the pawls.

6. The electrical connector of claim 3, wherein the mechanism is biased such that when the pressurized gas is not in the chamber, the pawls are in an engaged configuration that pulls the engagement pins into engagement with the receiving posts.

7. The electrical connector of claim 1, wherein the mechanism has its best mechanical advantage is at an extended position of the spring.

8. The electrical connector of claim 1,
further comprising an anvil;
wherein the anvil presses against a portion of the flex circuit that includes the contacts of the flex circuit, on an opposite side of the flex circuit from the contacts of the flex circuit.

9. The electrical connector of claim 1, further comprising a plurality of coaxial cables connected to the flex circuit.

10. The electrical connector of claim 1, wherein the fitting is a pressurized gas fitting for directing pressurized gas into the chamber.

11. An electrical coupling comprising:
a board having an array of board contacts; and
an electrical connector including:
   a flex circuit having multiple flex circuit contacts; and
   a spring-and-pressurized-gas mechanism for selectively pressing the contacts of the flex circuit against the board contacts; further comprising a pair of receiving posts adjacent to the board; and wherein the mechanism includes a pair of pawls that selectively hook and engage lips of the posts to press the flex circuit contacts against the board contacts.

12. The electrical coupling of claim 11, wherein the electrical connector includes a pair of engagement pins that are received in holes in the posts.

13. The electrical coupling of claim 11,
wherein the mechanism includes a piston and spring; and
wherein the pawls, the piston, and the spring are all mechanically coupled together such that movement of the piston changes an amount of compression of spring and moves the pawls.

14. The electrical coupling of claim 13, wherein the mechanism is biased such that when the pressurized gas is not in the chamber, the pawls are in a configuration that pulls the engagement pins into engagement with the receiving posts.

15. The electrical coupling of claim 13,
wherein the mechanism includes a pressurized gas fitting; and
wherein the fitting is in communication with a chamber on one side of the piston.

16. The electrical coupling of claim 13, wherein the mechanism has its best mechanical advantage is at an extended position of the spring.

17. The electrical coupling of claim 11, wherein the posts are fixedly attached to the board.

18. The electrical coupling of claim 17, wherein the electrical connector includes a pair of engagement pins that are received in holes in the posts as the electrical connector engages the board.

* * * * *